United States Patent
Chang

(10) Patent No.: US 6,261,436 B1
(45) Date of Patent: Jul. 17, 2001

(54) FABRICATION METHOD FOR GOLD BONDING WIRE

(75) Inventor: Tao-Kuang Chang, Chung Li (TW)

(73) Assignee: ASEP TEC Co., Ltd., Chung Li (TW)

(*) Notice: Subject to any disclaimer, the term of this patent is extended or adjusted under 35 U.S.C. 154(b) by 0 days.

(21) Appl. No.: 09/434,134

(22) Filed: Nov. 5, 1999

(51) Int. Cl.$^7$ .................................................... C25D 7/06
(52) U.S. Cl. ........................ 205/206; 205/138; 205/210; 205/222; 205/266
(58) Field of Search .................... 205/151, 247, 205/266, 85, 138, 206, 222, 210; 420/463, 501

(56) References Cited

U.S. PATENT DOCUMENTS

| | | |
|---|---|---|
| 3,844,909 * 10/1974 | McCary et al. | 204/40 |
| 3,865,701 * 2/1975 | Borgmann | 205/138 |
| 3,873,428 * 3/1975 | Winters | 204/15 |
| 3,905,828 * 9/1975 | Barber | 136/6 R |
| 5,679,232 * 10/1997 | Fedor et al. | 205/77 |

* cited by examiner

Primary Examiner—Kathryn L. Gorgos
Assistant Examiner—William T. Leader
(74) Attorney, Agent, or Firm—Dougherty & Troxell

(57) ABSTRACT

A gold bonding wire fabrication method, which includes the steps of (a) drawing a non-gold wire rod, for example, a pure silver wire rod or pure palladium wire rod into a core wire of thickness within about 1 $\mu$m~500 $\mu$m, (b) electroplating the core wire with a layer of gold plating of thickness within about 0.025 $\mu$m~25 $\mu$m.

1 Claim, 3 Drawing Sheets

FABRICATION METHOD FOR GOLD BONDING WIRE

BACKGROUND OF THE INVENTION

The present invention relates to a method of fabricating a gold bonding wire for use in IC, LED bonding, and more particularly to such a gold bonding wire fabrication method in which pure silver wire rod or pure palladium wire rod is drawn into a wire subject to the desired thickness, and then the pure silver wire or pure palladium wire is electroplated with a layer of pure gold coating. The invention relates also to a gold bonding wire made by this method.

Regular gold bonding wires for IC bonding are directly drawn from a gold wire rod. Because these gold bonding wires are directly drawn from pure gold wire rod, their material cost is high.

SUMMARY OF THE INVENTION

It is main object of the present invention to provide a gold bonding wire fabrication method, which is practical for the fabrication of a high-quality, low-cost gold bonding wire. It is another object of the present invention to provide a gold bonding wire, which is inexpensive to manufacture. According to the present invention, pure silver or palladium wire rod is drawn into a core wire subject to the desired thickness, and the core wire is then electroplated with a layer of gold coating. After processed through an after treatment and a series of quality tests, a finished, low cost gold bonding wire is obtained.

DETAILED DESCRIPTION OF THE PREFERRED EMBODIMENT

Figure 1:
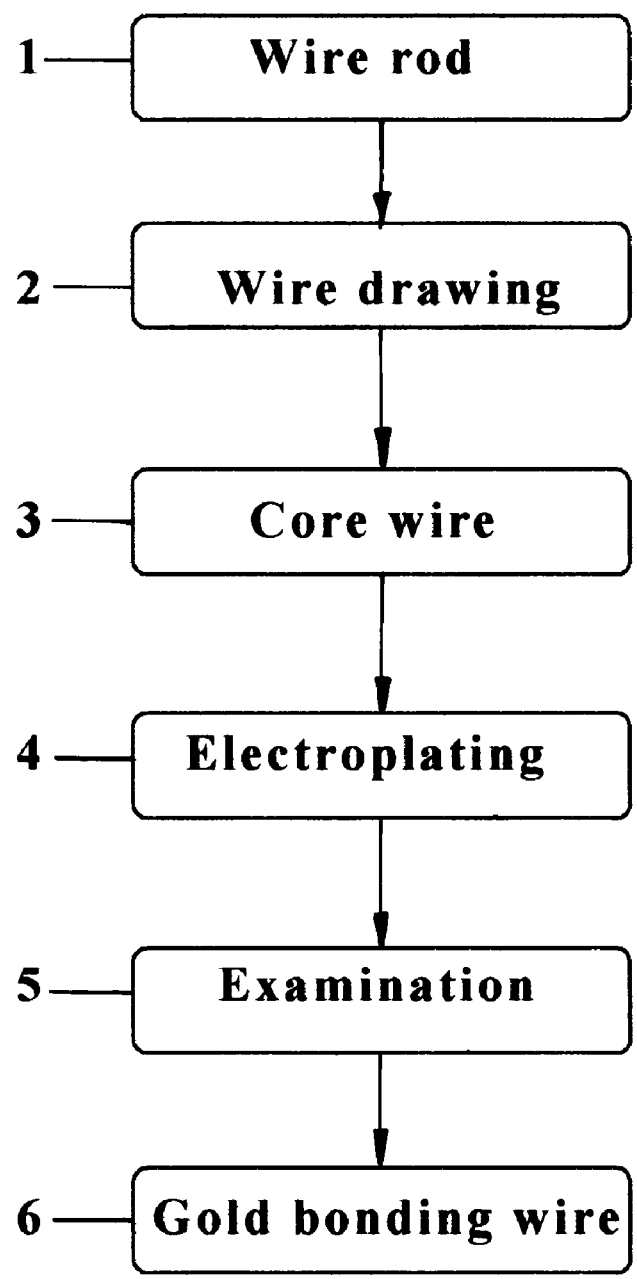
FIG. 1 is a flow chart explaining the fabrication of a gold bonding wire according to the present invention.
Figure 3:
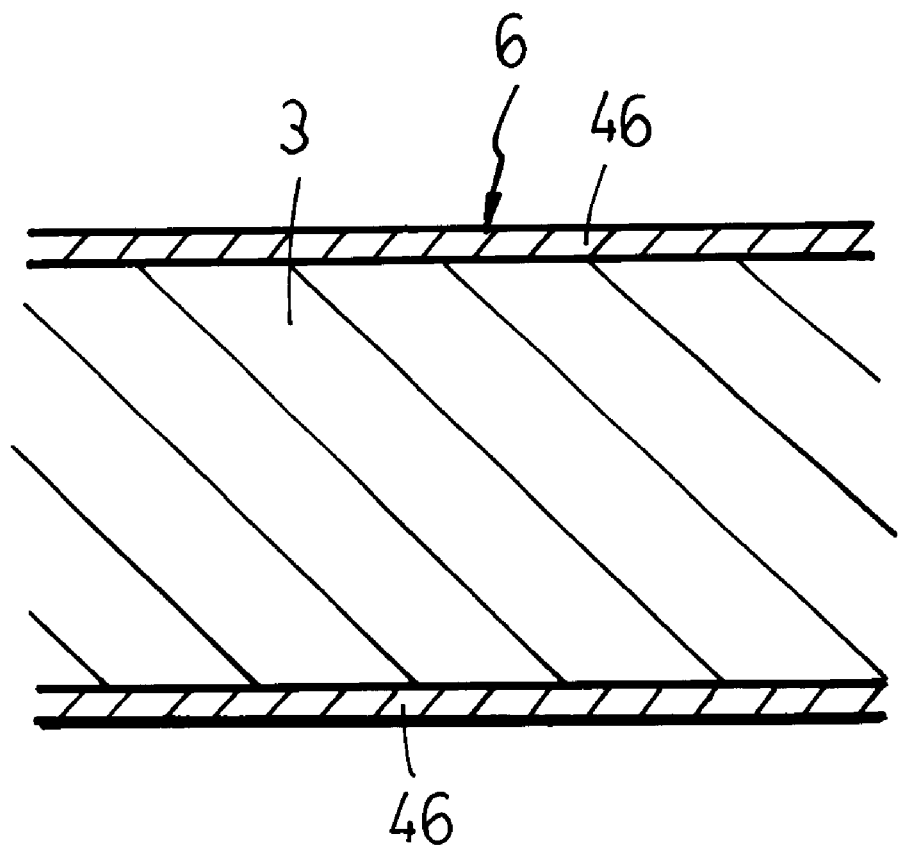
FIG. 3 is an enlarged view in section of a gold bonding wire according to the present invention.

Referring to FIGS. 1 and 3, a non-gold wire rod 1 is processed through a wire drawing process 2 and drawn into a core wire 3 subject to the desired thickness. The core wire 3 is then electroplated 4 with a layer of gold coating 46, and then examined 5. When passed through the inspection, a finished gold bonding wire 6 is thus obtained.

The aforesaid wire rod 1 is obtained from non-gold material in order to save material cost. According to tests, pure silver or pure palladium is the best choice for the non-gold wire rod 1, for the advantages of high signal conductivity and extendability.

During the aforesaid wire drawing process 2, the wire rod 1 passes through the mold eye on at least one wire drawing die, and is drawn into the desired core wire 3 of thickness within 1 $\mu$m~500 $\mu$m. In order to improve the corrosion resisting power and signal transmission stability, the core wire 3 is electroplated 4 with a layer of gold coating 46.

Figure 2:
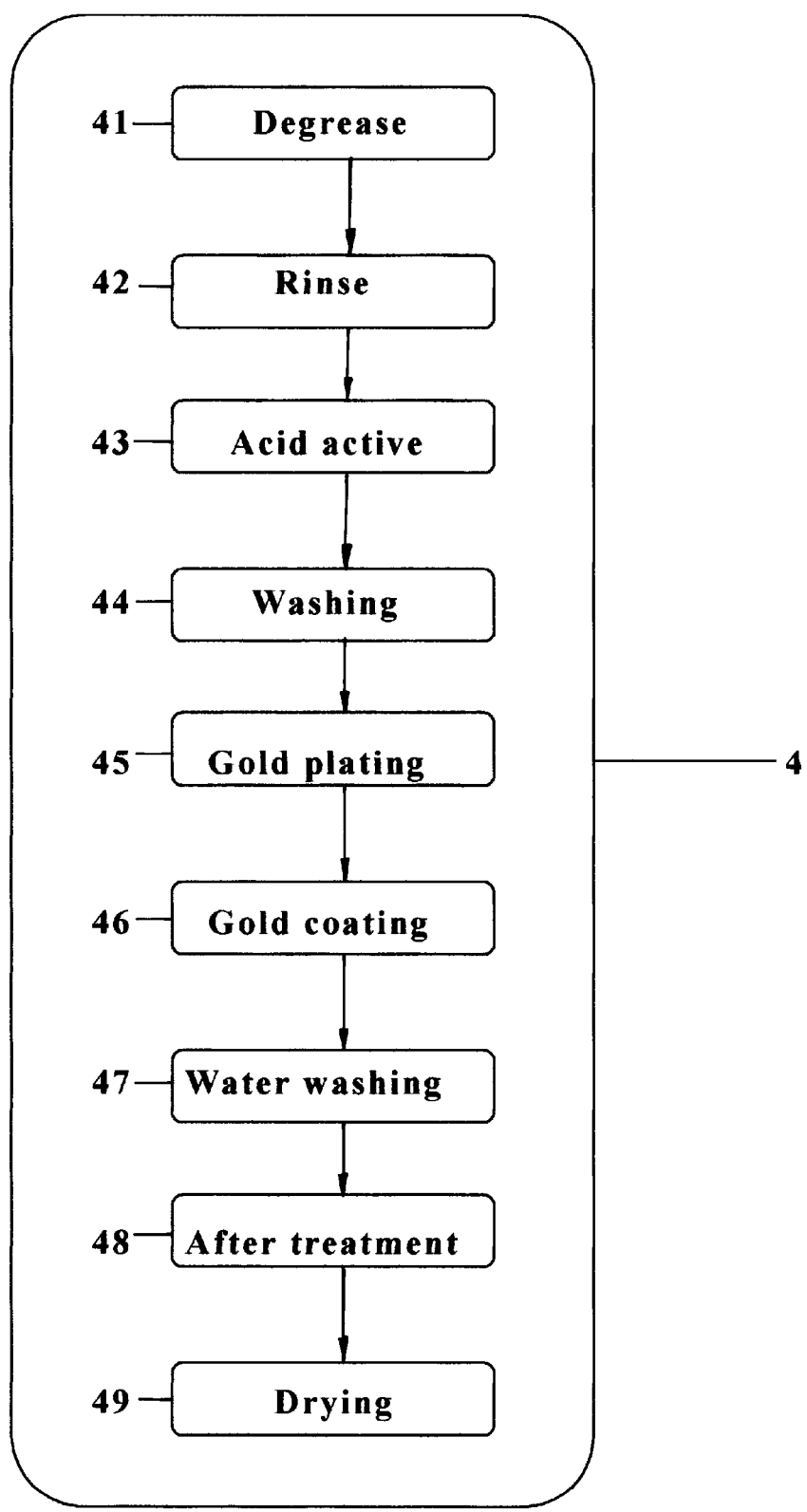
FIG. 2 is a flow chart explaining the electroplating process according to the present invention.

Referring to FIG. 2 and FIG. 3 again, the electroplating process 4 comprises in proper order, the step of degrease 41 where the core wire 3 is washed with an alkaline solution, the step of rinse 42 where the degreased core wire 3 is rinsed with clean water, the step of acid active treatment 43 where the degreased core wire 3 is treated with an acid active surface treatment, the step of washing 44 where the degreased, acid-activated core wire 3 is washed with clean water, the step of gold plating 45 where the core wire 3 is covered with a layer of gold coating 46, the step of washing 47 where the gold-plated core wire 3 is washed with water, the step of after treatment 48 where the surface of the gold coating 46 is smoothened, and the step of drying 49 where the gold plated core wire 3 is well dried. After drying, the electroplating process 4 is finished.

After the electroplating process 4, the finished gold bonding wire is examined through a series of tests including signal transmission conductivity test, mechanical property test, wire diameter measurement, material analysis, and impurity content test. When passed, a qualified gold bonding wire 6 is obtained.

As indicated above, the gold bonding wire 6 is comprised of a non-gold core wire 3, and a layer of gold coating 46 covered on the periphery of the non-gold core wire 3. Because the core wire 3 is drawn from pure silver or pure palladium, much material cost is saved.

What is claimed is:

1. A gold bonding wire fabrication method comprising the steps of:
   a) passing a core wire through a wire drawing die such that the core wire has a thickness of between 1 $\mu$m and 500 $\mu$m, the core wire selected from the group consisting of pure silver and pure palladium;
   b) degreasing the drawn core wire by passing the core wire through an alkaline solution;
   c) rinsing the degreased core wire;
   d) treating a surface of the core wire with an acid active surface treatment;
   e) washing the treated core wire with water;
   f) electroplating a single, outer layer of gold on the surface of the core wire, the gold layer having a thickness of between 0.025 $\mu$m and 25 $\mu$m; and,
   g) smoothing a surface of the gold layer.

* * * * *